United States Patent

LaCombe et al.

[15] 3,679,941

[45] July 25, 1972

[54] COMPOSITE INTEGRATED CIRCUITS INCLUDING SEMICONDUCTOR CHIPS MOUNTED ON A COMMON SUBSTRATE WITH CONNECTIONS MADE THROUGH A DIELECTRIC ENCAPSULATOR

[72] Inventors: Donald J. LaCombe, De Witt; Guy L. Babcock, North Syracuse, both of N.Y.

[73] Assignee: General Electric Company

[22] Filed: Sept. 22, 1969

[21] Appl. No.: 859,869

[52] U.S. Cl. ................................317/101 A, 156/3, 156/17, 317/234

[51] Int. Cl. ..........................................................H01l 19/00

[58] Field of Search ................317/101 A, 101 QP, 234, 221; 29/627, 589; 74/68.5, 110.6

[56] References Cited

UNITED STATES PATENTS

| | | | |
|---|---|---|---|
| 3,381,182 | 4/1968 | Thornton | 317/235 |
| 2,890,395 | 6/1959 | Lathrop et al. | 317/101 A UX |
| 3,107,197 | 10/1963 | Stein et al. | 174/110.6 UX |
| 3,136,897 | 6/1964 | Kaufman | 317/101 A UX |
| 3,158,788 | 11/1964 | Last | 317/101 A UX |
| 3,206,647 | 9/1965 | Kahn | 29/588 |
| 3,405,442 | 10/1968 | Caracciolo | 29/588 X |
| 3,475,664 | 10/1969 | De Vries | 317/235 |
| 3,488,429 | 1/1970 | Boucher | 174/68.5 |
| 3,488,834 | 1/1970 | Baird | 317/235 UX |
| 3,494,023 | 2/1970 | Dorendorf | 317/101 A UX |
| 3,501,832 | 3/1970 | Iwata et al. | 174/68.5 X |

*Primary Examiner*—David Smith, Jr.
*Attorney*—Marvin A. Goldenberg, Richard V. Lang, Frank L. Neuhauser, Oscar B. Waddell and Joseph B. Forman

[57] ABSTRACT

Integrated circuits in which individual semiconductor chips, exhibiting diverse electrical and compositional characteristics, may in combination with thin or thick film passive components be applied to a single supporting electric substrate. The chips and conductive patterns deposited on the substrate being encapsulated in a dielectric material, with electrical connections made to said chips and conductive patterns through openings formed in said dielectric layer.

8 Claims, 17 Drawing Figures

INVENTORS:
DONALD J. LaCOMBE,
GUY L. BABCOCK,

BY Marvin Goldenberg
THEIR ATTORNEY.

PATENTED JUL 25 1972 3,679,941

SHEET 2 OF 2

INVENTOR
DONALD J. LaCOMBE,
GUY L. BABCOCK,

BY Marvin D. Goldenberg
THEIR ATTORNEY.

COMPOSITE INTEGRATED CIRCUITS INCLUDING SEMICONDUCTOR CHIPS MOUNTED ON A COMMON SUBSTRATE WITH CONNECTIONS MADE THROUGH A DIELECTRIC ENCAPSULATOR

BACKGROUND OF THE INVENTION:

N:

1. Field of the Invention:

The invention relates to the field of integrated circuits and, more specifically, wherein a number of active components in the form of semiconductor chips are combined on a single substrate with passive film components for providing a wide range of circuit functions. As used in the present discussion, semiconductor chips are intended to include within their meaning all forms of miniaturized electronic components in packaged or quasi packaged form, such as monolithic chips, beam lead devices, hybrid devices, etc., which can be mounted and interconnected on a single substrate.

2. Description of the Prior Art:

Much work has been performed in the microminiature of integrated circuits directed to the goal of fabricating microminature electronic circuits of high complexity on a single supporting substrate. These efforts are generally divided into two categories, one termed a monolithic approach and the other a hybrid approach. In the monolithic a number of active devices, such as transistors and diodes, and resistive and capacitive passive components are fabricated from a single wafer of semiconductor material by means of conventional semiconductor processing techniques, i.e., diffusion, alloying, evaporation, etc. The various active and passive components are interconnected by metalization normally evaporated on the wafer surface. Photolithographic techniques are employed in the processing to achieve extremely small dimensions of all components. Accordingly, by means of this approach, a high degree of miniaturization can be accomplished.

However, the monolithic approach does have a number of inherent limitations. It is basically an inflexible process. Thus, should any single component on a monolithic chip prove bad, either the entire chip must be replaced or discretionary interconnection of the components must be made from which the bad component or components are excluded. The latter, however, adds considerable complexity to automated processing techniques. It may be appreciated that the noted inflexibility of the monolithic circuit becomes particularly burdensome for large scale integration. As a further limitation, since both active and passive components are fabricated from a single piece of semiconductor material, normally silicon, restrictions exist as to the choice of components in the circuit design. Thus, the active components must all be of a similar type so that, for example, both tunnel diodes and transistors cannot be fabricated on a single monolithic chip, nor can many different type transistors, etc. Further, only a limited range of resistance and capacitance, and no inductance at all, can be provided.

In addition, isolation between components is normally provided by back-biased p-n junctions, which form of isolation is often inadequate. This is especially true for high frequency operation, for example above 100 MHz. More recently dielectric isolation has been employed for improving the degree of isolation between components. Dielectric isolation is accomplished either by merely etching away excess silicon material from around the active components or by replacing the silicon with a dielectric material such as glass. This form of isolation, however, requires special processing techniques.

With respect to the hybrid approach, in general, individual semiconductor chips, each of which may include one or more active components normally processed using monolithic techniques, are applied to a supporting substrate and the individual chips interconnected. The outstanding advantages of this approach are that dissimilar active devices can be combined in an integral circuit on a single substrate, and chips can be tested and replaced individually as required. Further, using either thin film or thick film techniques, a relatively wide range of passive components of a resistive, capacitive or inductive type can be formed on the substrate and incorporated in the interconnection structure.

However, because the individual chips have a finite thickness on the order of several mils, a problem is presented with respect to providing connections between the chips and the conductor strips on the supporting substrate. The oldest and still the most common procedure is to bond the semiconductor chips to the supporting substrate with the metalization up. Extremely fine wires, normally of gold, are then connected to the contact pads on the chip and to terminals on the substrate by ultrasonic bonding, compression welding or other techniques known to the art. This procedure must be performed by hand and is uneconomical. In addition, the contacts made are unreliable and easily broken.

Several automated and semi-automated procedures have been developed in the past few years. In one such development, complete conductive patterns are first formed on the surface of the supporting substrate and the semiconductor chips are then applied to the substrate, metalization down, commonly known as the "flip-chip" method. In this method tiny metal balls are formed either on the chip or on terminals of the substrate and contact is made between the chips and the conductive patterns by soldering at the points where the balls are formed. Whereas the flip-chip method is satisfactory for relatively large dimensioned structures, it cannot readily be employed for high density, high resolution work, or where a relatively large number of solder connections are to be made. In another development, semiconductor chips are fabricated with stiff or "beam" leads attached. With the chips in place on the substrate, the leads may be bonded in a single operation to terminal pads on the substrate. Although possessing certain advantage over the "flip-chip" method, considerable complexity is introduced into fabrication of the individual chip. Further, because of the protruding leads, a high degree of care in handling is required.

More recently, there has been developed a unique method of mounting numerous semiconductor chips on a common substrate and making connection thereto employing chemical, metallurgical and photolithographic techniques comparable to those used in the fabrication of a monolithic semiconductor chip per se. In this process the semiconductor chips are bonded to the substrate by a thermoplastic material and coplanar connections made to the chips on the surface of the thermoplastic material. A complete disclosure of the structure is provided in an application for U.S. Letters Pat., Ser. No. 687,278, filed Dec. 1, 1967 by C. S. Kim and G. G. Palmer, entitled "Composite Integrated Circuits with Coplanar Connections to Semiconductor Chips Mounted on a Single Substrate," assigned to the assignee of the present invention. The present invention represents a modification and improvement of the structure disclosed therein.

SUMMARY OF THE INVENTION:

It is accordingly an object of the invention to provide a novel integrated structure having individual semiconductor chips exhibiting diverse electrical and compositional characteristics applied to a single supporting substrate in combination with film processed passive circuit components wherein said chips are entirely encapsulated in a dielectric material and connections may be readily made thereto through said dielectric material.

It is a further object of the invention to provide a novel integrated circuit structure as above described wherein said connections are made employing metalization techniques conventionally utilized in monolithic processing.

It is another object of the invention to provide a novel integrated circuit structure as above described which permits the applied chips to include a number of semiconductor materials, such as silicon, germanium and gallium arsenide, etc., and the active circuit components to said module to be of different types including a variety of transistors, diodes and tunnel diodes, etc.

It is a further object of the invention to provide a novel integrated circuit structure as described above wherein batch processing techniques can be employed for fabricating the passive components and the entire interconnection arrangement.

It is yet a further object of the invention to provide a novel integrated circuit structure as described above which incorporates multilayer interconnections.

It is another object of the invention to provide a novel integrated circuit structure as above described wherein connections are readily made to both interior and exterior contact electrodes on the semiconductor chips.

It is yet another object of the invention to provide a novel integrated circuit structure as above described wherein connections can be made to opposite faces of the semiconductor chips.

A further object of the invention is to provide a novel method of fabricating an integrated circuit structure of the above described type.

These and other objects of the invention are accomplished with respect to a structure which includes a rigid dielectric substrate for supporting a said of semiconductor chips having metalized contact electrodes on one or more faces thereof. The substrate further supports conductor strips having terminal electrodes intended to be connected to said contact electrodes. The chips are bonded to the substrate with said contact electrodes in registry with said terminal electrodes. An encapsulating dielectric material overlays said substrate and semi-conductor chips. Openings are formed within said dielectric material which are in alignment with said contact and terminal electrodes. Metalization deposited on the surface of said dielectric material enters said openings and makes electrical connection between the conductor strips on said substrate and the semiconductor chips. The electrical connections may be formed by a photolithographic process. The encapsulating dielectric material must be chemically inert so as to be highly etch resistant; it must be capable of performing a strong bond at heating temperatures that are not excessive, in particular lower than the eutectic temperature of the metalization on the chips and on the substrate; it should be a low loss dielectric material; it should have stable electrical and thermal properties; and it should have high mechanical strength. Fluorinated ethylene propylene; (FEP) Teflon, has been found to be an extremely desirable material for providing the encapsulation.

In one specific embodiment of the invention, the terminal electrodes are provided by mesa formations extending above the substrate, and a layer of dielectric material overlays the substrate and conductor strips with its surface at about the level of the mesa formations. The semiconductor chips are embedded in the dielectric layer face up, with the contact electrodes flush with the surface. Over this structure is applied a cover layer of dielectric material so as to complete the encapsulation.

In a further specific embodiment of the invention, the semiconductor chips are bonded directly to the substrate. The terminal electrodes are again provided by mesa formations. A layer of dielectric material overlays the substrate chips and mesa formations. The direct bond to the substrate provides good thermal conduction properties. Further, electrical connection can be made to chips having contact pads on both top and bottom surfaces.

In yet a further embodiment of the invention, a mesa-less structure is provided. Connections are made to the terminal electrodes by extending the openings made in the dielectric material to the level of the conductor strips.

BRIEF DESCRIPTION OF THE DRAWING:

The specification concludes with claims particularly pointing out and distinctly claiming the subject matter which is regarded as the invention. It is believed, however, that both as to its organization and method of operation, together with further objects and advantages thereof, the invention may be best understood from the description of the preferred embodiments, taken in connection with the accompanying drawings in which:

Figure 1A:
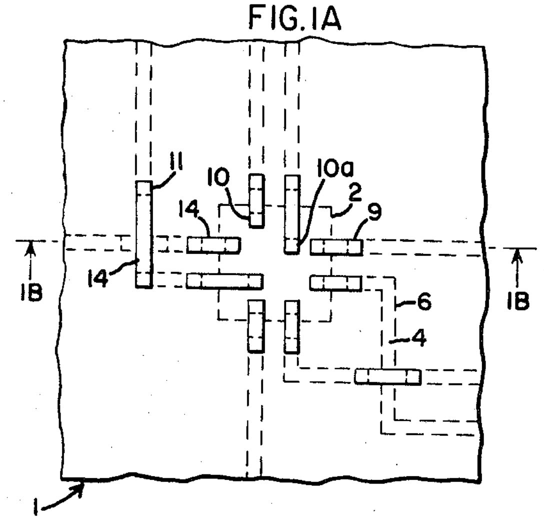
FIG. 1A is a plan view of an integrated circuit structure segment, in accordance with a first embodiment of the invention, illustrating a single semiconductor chip adhered to the substrate by being embedded in a layer of dielectric material.

DESCRIPTION OF THE PREFERRED EMBODIMENTS:

With reference to FIG. 1A, there is illustrated in plan view an integrated circuit structure segment 1 in accordance with a first embodiment of the invention. For purposes of explanation, only a portion of a complete circuit structure, greatly enlarged, has been shown to facilitate explanation of the invention, including a single semiconductor chip 2 mounted on a supporting substrate 3, identified in FIG. 1B, in combination with interconnecting conductors and passive circuit components. The invention offers complete flexibility in bonding numerous different type semiconductor chips to a common substrate selected from a number of materials and for employing a wide range of passive components in the interconnecting structure. As specific features of the illustrated structure; it makes possible electrical connections directly to the chip, which can be readily performed by photolithographic techniques commonly employed in monolithic fabrication and it accommodates crossover connections in the interconnection structure.

The supporting substrate 3 is a dielectric material of good insulating properties, typically alumina ($Al_2O_3$), beryllia or glass for both low and microwave frequency applications. The embodiment under consideration employed alumina. Where relatively large values of inductance are to be provided in the peripheral circuitry, for example above 75 nanohenries, ceramic magnetic materials exhibiting a wide range of magnetic properties, such as ferrite or garnet, may be used as the substrate. Ferrite or garnet materials can also be employed for microwave applications. The thickness of the substrate is typically on the order of twenty to thirty mils.

Overlaying the substrate surface are formed thin layer conductive patterns which include a high conductivity material 4 such as gold, aluminum or copper, and a resistive material 5, such as chromium or nichrome. The conductive patterns serve to interconnect the semiconductor chip 2 to other chips common to the substrate 3 and to external terminals on the substrate 3, which are not shown in FIG. 1A. Strips 6 of the high conductivity material 4 serve as conductors.

Figure 1B:
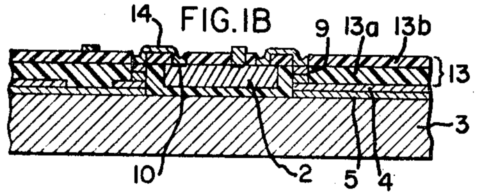
FIG. 1B is a cross sectional view of FIG. 1A taken along the plane 1B—1B.
Figure 2B:
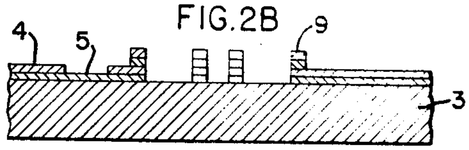
FIG. 2B is a cross sectional view of FIG. 2A taken along the plane 2B—2B.
Figure 3A:
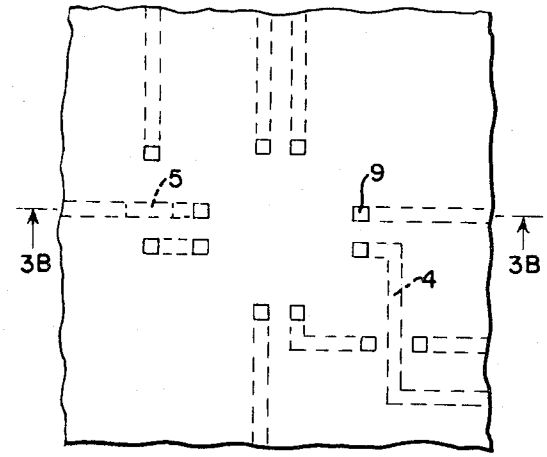
FIG. 3A is a plan view of the structure of FIG. 1A after a second stage in the fabrication process with a layer of dielectric material overlaying the conductive pattern and bonded to the substrate.

The resistive material 5 directly overlays the substrate surface and the high conductivity material 4 overlays portions of the resistive material, as best illustrated in the cross sectional view of FIG. 1B taken along the plane 1B—1B in FIG. 1A. It is noted that for purposes of illustration the view of FIG. 1B and the other cross sectional views in the drawing are not in precise proportion. The conductive patterns formed of the highly conductive material 4 and the resistive material 5 are processed using conventional additive or subtractive techniques.

A plurality of terminal electrodes 9 are constructed at end points on the conductor strips for making electrical connection directly to contact electrodes 10 on the semiconductor chip 2. Contact electrodes 10*a* are interior electrodes to which connections are also made. The electrodes 9 are mesa structures that extend above the conductive patterns, as seen in FIG. 1B. Further electrode mesa structures 11 are formed at intermediate points on the conductor strips 6 for providing crossover connections. A dielectric bonding material 13 overlays the conductive pattern and the semiconductor chip 2 is encapsulated face up within said dielectric material and firmly bonded thereby to the substrate. Although the conventional aluminum metalization for the contact pads 10 may be suitable for many applications, it is preferable that the chip have a non-oxidizing metalization, of which gold is the most common, for providing the most reliable electrical connection thereto.

A fluorinated ethylene propylene (FEP) Teflon has been employed as the dielectric material 13. It is a thermoplastic material having a number of properties that make it eminently suitable for the present use. The material provides a strong bond at heating temperatures that are below the eutectic temperatures of the metalization on the substrate surface and on the semiconductor chip, and yet remains hard over a suitable range of operating temperatures. It possesses extremely good dielectric properties over a wide range of frequencies. FEP Teflon is chemically inert so as to be highly resistant to most etch solutions. It resists shrinkage and accommodates strains well within the material so that once the bond is formed bonded surfaces remain secure. Further, the material is highly moisture resistant and exhibits good temperature stability. It is recognized that other materials within the family of thermoplastics, and also outside, which possess comparable properties to those described can also be employed for the dielectric material 13 as appropriate to a given application. For example, a number of the fluoroplastics appear to be suitable materials, such as chlorotrifluoroethylene under the trade names of Kel-F or Plaskon, polyvinylidene fluoride under the trade name of Kynar or polyphenylene oxide.

The semiconductor chip 2 can be one of a number of chips commercially available, or be a specially fabricated chip, providing operation ranging from a simple circuit function to a systems function. It may include from a single to a large number of active components, such as transistors, diodes or tunnel diodes, directly connected together or connected in combination with passive components. Although the invention is contemplated to have principal application relative to highly miniaturized chips, and in particular of the monolithic type, it is also useful with respect to providing interconnection for hybrid or other integrated circuit devices of somewhat larger dimensions than monolithic. The present embodiment contemplates a chip dimension of about 40 mils square and a thickness of one and one half to two mils. Commercial monolithic chips which are normally 7 to 10 mils thick can readily be lapped to achieve this thickness. It should be clear, however, that for purposes of the invention neither the internal construction, the electrical arrangement nor the overall dimensions of the chips are critical.

Overlaying the surface of the dielectric material 13 are formed further conductor strips 14 which penetrate the dielectric material at numerous points so as to connect the mesa electrodes 9 to the contact pads 10 for providing electrical connection between the semiconductor chip 2 and the peripheral circuitry. In addition, the conductor strips 14 extend between the mesa electrodes 11 for providing crossover connections as may be required.

Figure 2A:
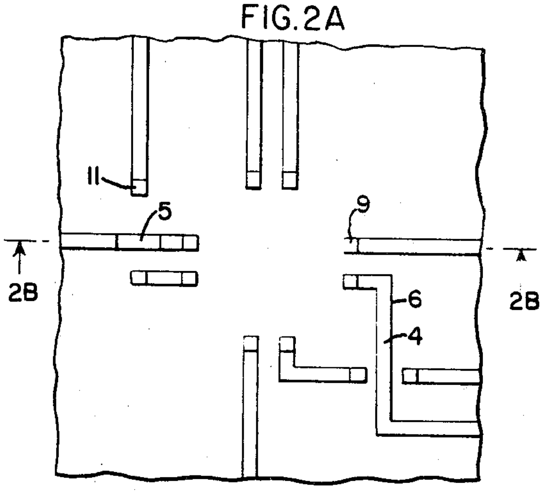
FIG. 2A is a plan view of the structure of FIG. 1A after the completion of the first stage in the fabrication process with a conductive pattern overlaying the substrate surface.

By referring to FIGS. 2A through 5B, fabrication of the present integrated circuit structure will be considered in greater detail. In the plan view of FIG. 2A and the cross sectional view of FIG. 2B taken along the plane 2B—2B in FIG. 2A, is shown the structure 1 at a first stage in the fabrication when the conductive patterns and the mesa formations have been completed on the surface of the substrate 3. In a given processing operation, the substrate 3 initially has a continuous layer of the resistive material 5, in the present case chromium, deposited over the entire surface. The resistive layer is applied by conventional metalization processing, typically evaporation, to a thickness of from 500 to 1000 angstroms. The entire surface of the material 5 is coated with a photoresist material, e.g., Kodak Ortho Resist, which is a negative photoresist. By conventional optical procedures used in photolithography, a first exposure is made through a photo mask which defines a pattern of the chromium to be retained, said pattern including all highly conductive areas as well as the resistive areas. The etch solution employed in the developing process is one which selectively attacks the unexposed chromium. Thus, all but the retained pattern of chromium is removed down to the substrate.

The surface is then cleaned and a second coat of photoresist material is applied. A second exposure is made through a photo mask which defines a pattern of the highly conductive material to be deposited, in the present case, gold. Thus, windows are formed in the photoresist layer and gold evaporated through them to form the conductor strips and other highly conductive areas with a thickness of about 5 to 7 microns.

The conductor and resistive strips can also be formed by a subtractive process wherein continuous layers of chromium or gold are deposited onto the substrate. The gold is first selectively etched down to the chromium by photolithographic techniques to define a pattern including all highly conductive areas. The chromium is then selectively etched to form the resistive strips.

The mesa structures are formed of a highly conductive metal capable of being applied to a thickness of several mils; copper is a suitable metal for this purpose. Accordingly, the surface thus far formed is cleaned and a thin film of copper evaporated over the entire area. A thick film of copper is then electroplated over the surface followed by a thick film of electroplated gold, so as to be commensurate with the height at which the mesas are to be constructed. In the embodiment under consideration, copper is electroplated to a thickness on the order of 1½ mils and the gold to a further thickness of 1½ mils. The surface is then cleaned and the photoresist is applied. A third photo mask, which defines a pattern of the mesa structures is next employed and the gold and copper selectively and sequentially exposed through said mask. In developing the mesa formations, a first etch solution is employed that attacks the gold but not copper. A second etch solution is then employed that attacks the copper but not the gold or chromium.

In the following steps of the process, a first layer 13*a* of dielectric material is applied to the substrate over the conductive patterns and mesa formations. In the application of FEP Teflon as the dielectric layer 13*a*, a FEP dispersion primer material is first applied to the surface. This can be sprayed on or applied with a dropper and spun off. The primer is fused by heating to about 370° C. Following the application of primer, a sheet of FEP Teflon is then pressed at approximately 320° C and a pressure of between 100 to 500 psi. At this stage in the fabrication the structure appears as illustrated in the cross sectional view of FIG. 3B taken along the plane 3B—3B in FIG. 3A.

Figure 4A:
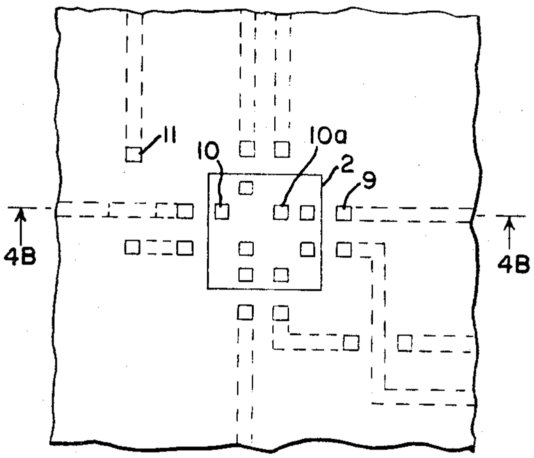
FIG. 4A is a plan view of the structure of FIG. 1A after a third stage in the fabrication with the semiconductor chip embedded within the layer of dielectric material.
Figure 3B:
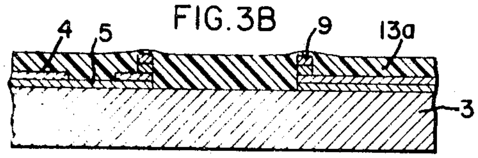
FIG. 3B is a cross sectional view of FIG. 3A taken along the plane 3B—3B.
Figure 4B:
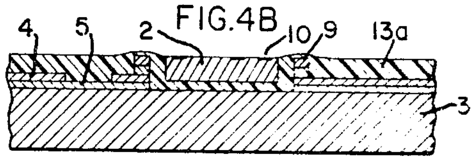
FIG. 4B is a cross sectional view of FIG. 4A taken along the plane 4B—4B.

The semiconductor chip 2 is then registered on the surface of the dielectric layer 13*a* and pressed, face up, as shown in the plan view of FIG. 4A and the cross sectional view of FIG. 4B, taken along the plane 4B—4B in FIG. 4A. Embedding of the chip is accomplished with a platen heated to about 260° C and exerting a pressure of between 30 to 60 psi so that the contact electrodes are about flush with of the surface f Teflon. At the indicated temperature, which is just below the melting temperature range of the Teflon, this material is softened sufficiently so that the chip is embedded straight into the material with a minimum of lateral movement. As the chip is pressed into the heated Teflon, the material spreads laterally around the mesa structures.

A cover layer 13*b* of dielectric material is placed over and adhered to the structure thus far described, in particular the first dielectric layer 13*a* and the semiconductor chip 2. This is shown in the plan view of FIG. 5A and the cross sectional view of FIG. 5B taken along the plane 5B—5B in FIG. 5A. The thickness of the dielectric layer 13*b* is typically ½ mil. In the specific embodiment under consideration, the layer 13*b* is composed of an FEP Teflon material of identical type to that of the first layer 13*a*. Bonding of the layer 13*b* to the layer 13*a* and chip 2 may be accomplished by heating said layers to a temperatures of about 260° C under a pressure of approximately 30 to 60 psi. Application of the indicated temperature and pressure is found to provide an adequate bond of the cover layer 13*b* to the underlying structure while avoiding lateral movement of the chip. The dielectric layers 13*a* and 13*b* may also be composed of different type FEP Teflon materials, or of diverse materials having properties comparable to FEP Teflon. The principal requirements are that a good adhesion be provided and that the chip maintain its position during the bonding process.

Openings 15 are made in the dielectric layer 13*b* in alignment with the contact electrodes 10 and the mesa structures 9 and 11. The openings extend completely through the layer 13*b* so as to expose the underlying metal electrodes. In practice, the width dimensions of the openings are made slightly less than the areas of the metal electrodes. A novel method of simultaneously making the openings 15 using batch processing and photolithographic techniques is described in detail in applicants' copending application for U. S. Letters Pat., entitled "Selective Plasma Etching of Organic Materials Employing Photolithographic Techniques," Ser. No. 859,870, filed Sept. 22, 1969.

Briefly, in the plasma etch process, a photoresist material is coated on the surface of the dielectric layer 13b. A suitable photo-resist material is Shipley AZ-111, which is a positive photoresist, applied to a thickness of a few tenths of one mil. The photoresist material is exposed to ultraviolet light through a photomask. The photomask defines a pattern of the holes to be formed in the dielectric layer 13*b*, these areas of the photomask being transparent to ultraviolet light, and the remaining area opaque. Upon developing the photoresist in a suitable etch solution, the exposed areas of the photoresist are attacked and dissolved away down to the dielectric layer. Thus, a photoresist mask having windows corresponding to the regions of the dielectric layer 13*b* which are to be etched overlays said dielectric layer.

The structure is then subjected to a selective plasma attack which occurs within an RF plasma reaction chamber having an oxygen atmosphere. By providing a flow of oxygen over the masked surface, areas of the dielectric material that are exposed to the plasma mask are oxidized and removed. Upon the holes in the dielectric layer 13*b* being etched completely through to the metal electrodes, the structure is removed from the reaction chamber and the photoresist material is dissolved away.

Figure 6:
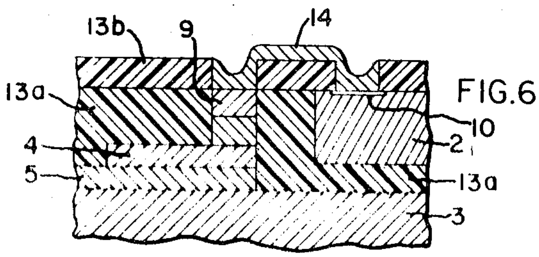
FIG. 6 is an enlarged segmented cross sectional view showing link metalization through openings in the dielectric layer for the embodiment of FIGS. 1A to 5B.
Figure 5A:
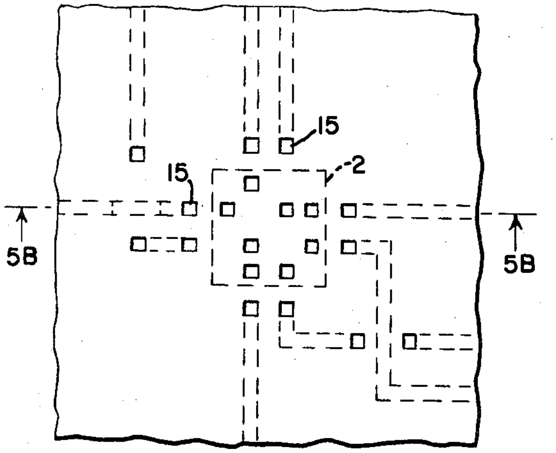
FIG. 5A is a plan view of the structure of FIG. 1A with the chip encapsulated by a cover layer of dielectric material having openings formed therein.
Figure 5B:
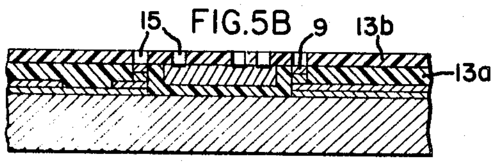
FIG. 5B is a cross sectional view of FIG. 5A taken along the plane 5B—5B.

The structure is then ready for the final metalization steps. In the embodiment under consideration an extremely thin layer of chrome is first evaporated over the entire surface of the dielectric layer 13*b* and into the openings 15. On top of the chrome is evaporated a layer of copper to a thickness of about one micron. Since the copper-chrome metalization is considerably thinner than the depth of the holes 15, the holes are not completely filled by the metalization, but rather the walls of the holes are coated. This is shown more clearly in the enlarged segmented cross sectional view of FIG. 6. In order to provide a uniform thickness of the metalization on the walls of the holes 15, it is desirable to perform the evaporation process from four sides.

A photoresist material, such as Kodak Ortho Resist, is next deposited over the copper and exposed through a final photo mask which containS the link metalization patterns. An etch solution attacks the unexposed copper and thereby forms the link metalization, which is composed of the conductor strips 14 as shown in FIG. 1A.

An additive process can alternatively be employed for forming the link metalization wherein the photoresist layer is first formed over the entire surface and exposed to a photo mask for providing windows where the conductive pattern is to be. The chrome and copper layers are successively evaporated through the windows to complete the process. It may be appreciated that the metalization need not be limited to the specific example given but may include other conductive materials, e.g., a gold-chrome metalization.

Figure 7A:
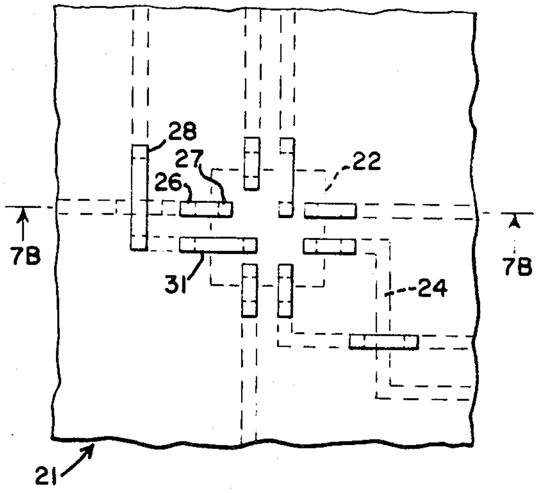
FIG. 7A is a plan view of an integrated circuit structure segment, in accordance with a second embodiment of the invention, illustrating a single semiconductor chip bonded directly to the substrate.
Figure 7B:
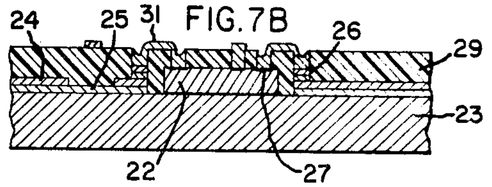
FIG. 7B is a cross sectional view of FIG. 7A taken along the plane 7B—7B.

In FIG. 7A there is illustrated in plan view an integrated circuit structure segment 21, in accordance with a further embodiment of the invention, wherein a semiconductor chip 22 is bonded directly to a dielectric substrate 23 and overlaid by a single layer 29 of dielectric material, most clearly indicated in the cross sectional view of FIG. 7B taken along the plane 7B—7B in FIG. 7A. The integrated circuit segment 21 is otherwise similar in its construction and composition to the integrated circuit segment 1 of the previously considered embodiment. Accordingly, conductive patterns are on the surface of the substrate 23 composed of strips of high conductivity material 24 overlying strips of resistive material 25. Mesa formations 26 are constructed at end points on the conductor strips for making electrical connection to contact electrodes 27 on the chip 22, and mesa structures 28 provide crossover connections.

The semiconductor chip 22 may be bonded to the substrate 23 by a eutectic bonding technique well known to the art. In this, the semiconductor chip is provided with a metal backing layer, typically gold, and a metal pre-form, such as a gold-tin or gold-germanium solder, is coated on the substrate. This chip is then placed on the pre-form and heated to where the metals fuse. Alternatively, a high temperature adhesive, such as a polyimide material, may be employed to bond the chip to the substrate.

The layer of dielectric material 29, which may be an FEP Teflon or other suitable dielectric material as described, completely overlays and encapsulates the conductive pattern and semiconductor chip. The dielectric layer has a thickness slightly greater than that of the semiconductor chip 22 so that about ½ mil of the material covers the chip. For example, for a chip thickness of 2 mils the dielectric layer 29 will have a thickness of 2½ mils. The layer 29 may be bonded to the substrate 23 and semiconductor chip 22 in a similar manner as that described with respect to the dielectric layer 13*a* of the previous embodiment. Openings are provided within the dielectric layer 29 in alignment with the contact electrodes 27 and the mesa structures 26 and 28 for exposing the underlying metal electrodes. The openings may be made by a plasma etch process as previously discussed. A final link metalization 31 fills the openings and makes connection between terminal electrodes 26 and contact electrodes 27, as well as between pairs of terminals 28. The process employed for the link metalization may be the same as that described in the previous embodiment.

Figure 8A:
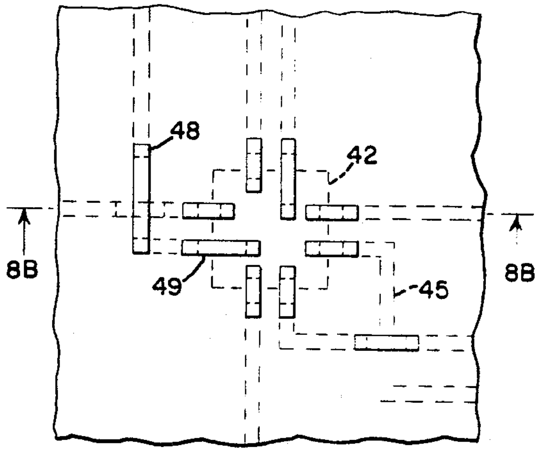
FIG. 8A is a plan view of an integrated circuit structure segment, in accordance with a fourth embodiment of the invention, illustrating a mesa-less conductive pattern on the substrate.
Figure 8B:
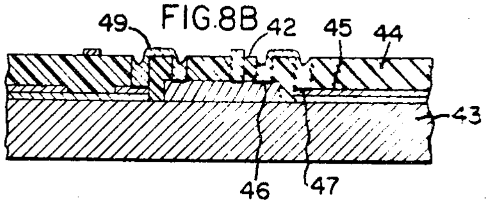
FIG. 8B is a cross sectional view of FIG. 8A taken along the plane 8B—8B.

A third embodiment of the invention which does not require built up mesa formations on the substrate conductive pattern is illustrated in the plan view of FIG. 8A and the cross sectional view of FIG. 8B taken along the plane 8B—8B in FIG. 8A. A semiconductor chip 42 is bonded directly to the substrate 43 with a single dielectric layer 44 overlying and encapsulating the chip and a two layer conductive pattern 45, being in this respect similar to the embodiment of FIGS. 7A and 7B. The semiconductor chip 42 is provided with contact electrodes 46. The conductive pattern 45 has terminal electrodes 47 located at end regions and electrodes 48 at intermediate regions, electrodes 47 and 48 being composed of portions of the conductor layer. Openings are etched through the dielectric layer 44 in alignment with the electrodes 46, 47 and 48, the holes extending completely through the dielectric material to the metal. A link metalization 49 fills the openings and makes contact between the chip contact electrodes 46 and terminal electrodes 47, and between pairs of intermediate electrodes 48.

Figure 9A:
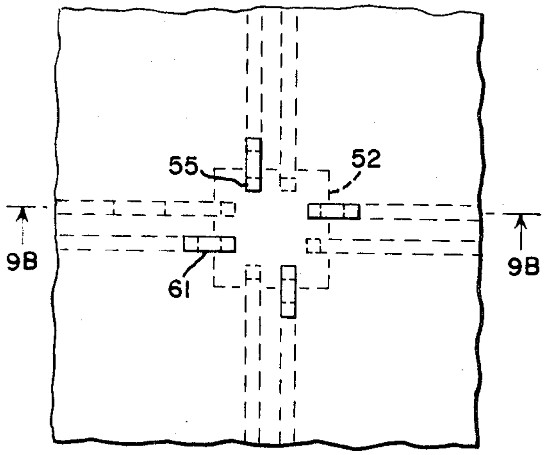
FIG. 9A is a plan view of an integrated circuit structure segment, in accordance with a third embodiment of the invention, illustrating an encapsulated bonded down semiconductor chip with connections made to top and bottom faces.
Figure 9B:
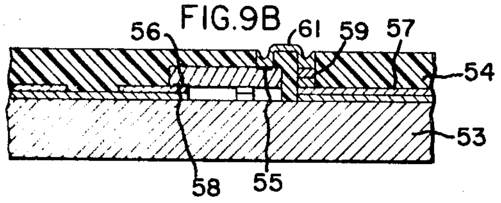
FIG. 9B is a cross sectional view of FIG. 8A taken along the plane 9B—9B.

With reference to FIG. 9A, there is illustrated a fourth embodiment of the invention wherein a semiconductor chip 52 is provided with electrical connections to both top and bottom faces. The chip is bonded to a dielectric substrate 53 through contact electrodes on the bottom face, with the structure overlaid by a single dielectric layer 54. Accordingly, chip 52 has a first set of contact electrodes 55 on the top surface and a second set of contact electrodes 56 on the bottom surface. A two layer conductive pattern 57 is formed on the surface of the substrate 53 provided with terminal electrodes 58 nd 59. As shown more clearly in the cross sectional view of FIG. 8B taken along the plane 8B—8B of FIG. 8A, electrodes 58 are composed of end regions of the conductor layer and electrodes 59 are mesa formations. The chip 52 is bonded to the substrate 53 by adhering contact electrodes 56 to the terminal electrodes 58, which also provides electrical connection between the conductive pattern 57 and the bottom surface contact electrodes. A eutectic bond may be employed for the operation. Openings are etched through the dielectric layer 54 in alignment with the contact electrodes 55 and the terminal electrodes 59. A link metalization 61 enters the openings to connect the conductive patterns 57 to the top surface contact electrodes.

What we claim as new and desire to secure by Letters Patent of the United States is:

1. An integrated circuit structure, comprising:

a. a dielectric substrate, b. a plurality of terminals mounted on said substrate, c. a semiconductor chip having at least one contact electrode on one face thereof mounted face up on said substrate, d. plastic dielectric material overlaying and bonded to said semiconductor chip, said terminals and dielectric substrate, said material having a plurality of openings formed therein which are in alignment with said terminals and said contact electrode, and e. metallizations of electrically conductive material formed upon and continuously supported along their length by said dielectric material and entering said openings for making electrical connection between said contact electrodes and said terminals.

2. An integrated circuit structure as set forth in claim 1 wherein a conductive pattern is provided overlaying said substrate, regions of which provide said terminals.

3. An integrated circuit structure as in claim 2 wherein said metallizations of conductive material are film formations.

4. An integrated structure as in claim 3 wherein said terminal regions are comprised of mesa structures which are superimposed on said conductive pattern and constructed to the level of said contact electrodes.

5. An integrated circuit structure as in claim 3 wherein said metallizations of conductive material have a thickness within a range of about one micron to about one mil.

6. An integrated circuit structure as in claim 3 wherein said semiconductor chip is bonded directly to said dielectric substrate and overlayed by a layer of flourinated plastic.

7. An integrated circuit structure as in claim 3 wherein said semiconductor chip is embedded in a layer of fluorinated plastic and overlayed by a further layer of fluorinated plastic.

8. An integrated circuit structure as in claim 3 wherein said semiconductor chip has additional contact electrodes on the face opposite said one face, said conductive pattern having additional end terminal regions extending beneath said chip and directly connected to said additional contact electrodes.

* * * * *